(12) United States Patent
Summer

(10) Patent No.: US 7,477,096 B2
Summer
(45) Date of Patent: Jan. 13, 2009

(54) RADIATION TOLERANT DC/DC CONVERTER WITH NON-RADIATION HARDENED PARTS

(76) Inventor: Steven E. Summer, 1 Roned Rd., Shirley, NY (US) 11967

(\*) Notice: Subject to any disclaimer, the term of this patent is extended or adjusted under 35 U.S.C. 154(b) by 249 days.

(21) Appl. No.: 10/936,141

(22) Filed: Sep. 7, 2004

(65) Prior Publication Data

US 2006/0049864 A1 Mar. 9, 2006

(51) Int. Cl.
*G05F 1/10* (2006.01)
*H02M 3/07* (2006.01)
*H02M 3/335* (2006.01)
*H03K 17/687* (2006.01)
*H03L 5/00* (2006.01)

(52) U.S. Cl. .................. 327/543; 327/434; 327/589; 327/333; 323/282; 323/283; 323/284; 323/285; 323/286; 323/222; 323/234; 323/265; 323/266; 363/21.12; 363/21.15; 363/21.13; 363/21.01; 363/21.17; 363/21.18; 363/49

(58) Field of Classification Search ......... 323/282–286, 323/222, 234, 265, 266; 363/21.12, 21.15, 363/21.13, 21.01, 21.17, 21.18, 49, 21; 327/543, 327/434, 589, 333
See application file for complete search history.

(56) References Cited

U.S. PATENT DOCUMENTS

| 3,836,836 | A | | 9/1974 | Cowett, Jr. |
| 5,661,642 | A | \* | 8/1997 | Shimashita ............... 363/21.15 |
| 5,672,918 | A | \* | 9/1997 | Kimbrough et al. ......... 307/126 |
| 6,411,068 | B1 | \* | 6/2002 | Willis ......................... 323/282 |
| 6,982,883 | B2 | \* | 1/2006 | Summer .................. 363/21.12 |
| 7,132,877 | B2 | \* | 11/2006 | Summer ..................... 327/427 |
| 7,135,846 | B2 | \* | 11/2006 | Summer ..................... 323/284 |

\* cited by examiner

*Primary Examiner*—Akm E Ullah
*Assistant Examiner*—Jue Zhang
(74) *Attorney, Agent, or Firm*—Stephen E. Feldman

(57) ABSTRACT

A radiation tolerant high-power DC/DC converter is disclosed. The converter does not incorporate radiation-hardened parts, but instead uses p-channel FET switches that have a negative gate threshold voltage. With exposure to radiation, the gate threshold voltage decreases, becoming more negative. Thus, the gate is still controllable.

18 Claims, 1 Drawing Sheet

Circuit Topology for a Radiation Tolerant High Power DC/DC Converter

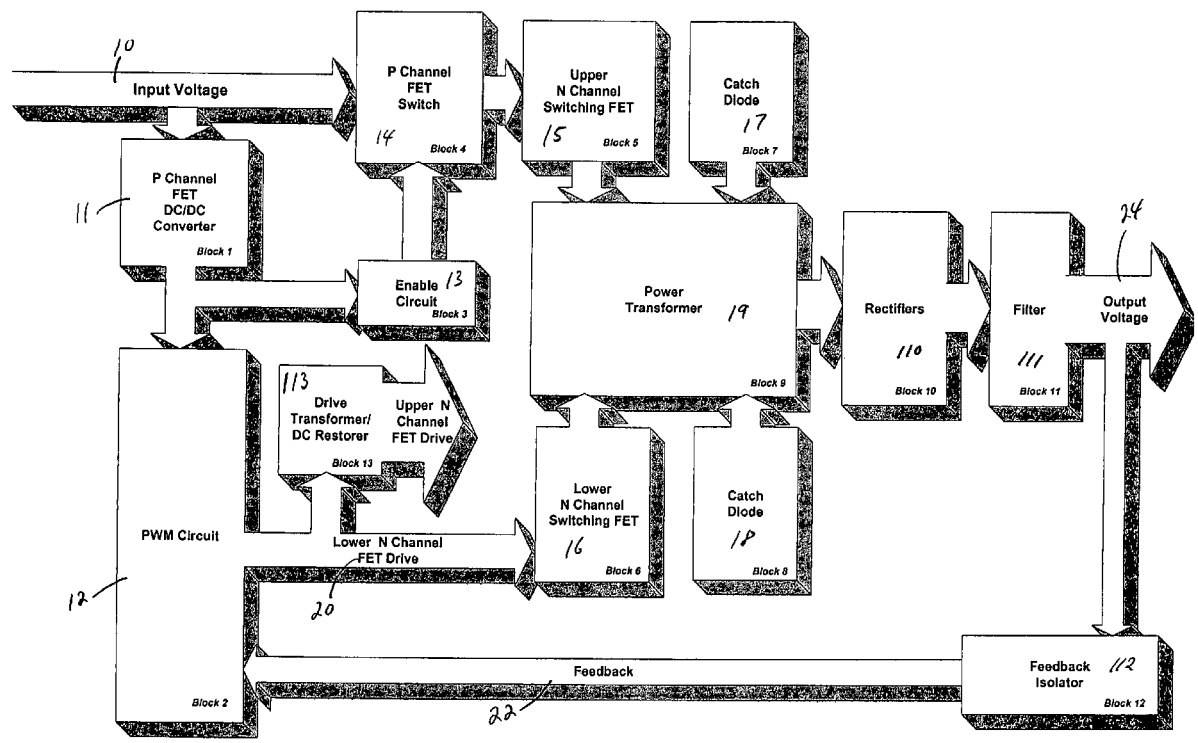

RADIATION TOLERANT DC/DC CONVERTER WITH NON-RADIATION HARDENED PARTS

FIELD OF THE INVENTION

The present invention deals with DC/DC converters and more specifically, radiation tolerant DC/DC converters.

BACKGROUND OF THE INVENTION

DC/DC converters are electronic devices that use switching components, such as field effect transistors (FETs) to transform voltage from one level to another. Typically, the output voltage is regulated and protected against short circuits. In many cases, the input and output potentials are galvanically isolated from each other.

In an FET, current flows along a semiconductor path called the channel. At one end of the channel, there is a source electrode, and at the other end, a drain electrode. The physical diameter of the channel is fixed, but its effective electrical diameter is changed by applying voltage to a gate electrode. The conductivity of the FET depends, at any given time, on the electrical diameter of the channel. A small change in gate voltage can cause a large variation in current from the source to the drain. In this way, the FET switches current on or off.

Typically, FETs used for power switching are enhancement mode types, that is, they are normally non-conducting. When a gate voltage above a certain threshold is applied, the FET becomes conducting. Such FETs are used to control current flow and are available in two gate polarities; N channel and P channel.

Among many applications, DC/DC converters are used in spacecraft, satellites and in high energy physics instrumentation where they are subjected to many forms of radiation damage. When electrical components are exposed to radiation, they behave differently. For example, when an N channel FET is exposed to relatively low radiation levels, the gate threshold voltage ultimately falls close to zero. In this condition, the FET conducts current with little or no applied gate voltage. In other words, the FET is uncontrollable because the current running through the channel cannot be shut off.

DC/DC converters designed for general purpose use are typically constructed with N channel FETs because, for any given die size transistor, the N channel FET has a lower on resistance than a correspondingly sized P channel FET.

To use electrical components in high radiation environments, they are radiation-hardened to withstand the damage caused by radiation. The radiation hardening process usually involves removing or adding some specific element or ions to the materials used for making the components. Being radiation hardened, the gate threshold voltage experiences minimal change after exposure to radiation. One method for chemically radiation hardening DC/DC converters is disclosed in U.S. Pat. No. 3,836,836 to Cowett, Jr. (Cowett).

Radiation hardened components, however, have limited sources, are expensive and take a long time to produce, creating higher prices and longer delivery times for the radiation tolerant DC/DC converters that incorporate the hardened materials. It is desireable, therefore, to provide electrical components with ordinary (non-hardened) materials that can function when exposed to radiation.

SUMMARY OF THE INVENTION

A radiation tolerant high-power DC/DC converter is disclosed. The converter does not incorporate radiation-hardened parts, but instead uses p-channel FET switches that have a negative gate threshold voltage. With exposure to radiation, the gate threshold voltage decreases, becoming more negative. Thus, the gate is still controllable.

Accommodation is made for n-channel FETs as well. A negative gate drive signal is provided to conventional n-channel FETs, so that even if they have been irradiated, they are still controllable despite the fact their gate threshold voltage has dropped below zero volts.

The radiation tolerant electrical component for providing controlled electrical response in radiation-intensive applications comprises a non-hardened p-channel FET supplying input voltage to a non-hardened n-channel FET with a negative bias to provide a controlled electrical output from the n-channel FET.

In further detail, the present invention provides a high-power DC/DC converter with a p-channel FET DC/DC Converter, a PMW circuit, an enable circuit, a DC restorer, a p-channel FET switch, an upper-n-channel FET, a lower-n-channel FET, a power transformer, an upper-catch diode, a lower-catch diode, a rectifier, a filter, and a feedback isolator. The p-channel FET DC/DC converter is operably connected to a voltage source; the PMW circuit is operably connected to the p-channel FET DC/DC converter; the enable circuit is operably connected to the p-channel FET DC/DC converter; the DC restorer is operably connected to the PMW circuit, the p-channel FET switch is operably connected to the voltage source; the upper-n-channel FET is operably connected to the p-channel FET switch; lower-n-channel FET is operably connected to the PMW circuit; the power transformer is operably connected to the upper and lower-n-channel switching FET; the upper and lower-catch diodes are operably connected to the power transformer; the rectifier is operably connected to the power transformer; the filter is operably connected to the rectifier; the feedback isolator is operably connected to the filter and PWM circuit.

BRIEF DESCRIPTION OF THE DRAWINGS

FIG. 1 is a block diagram of a circuit according to an embodiment of the present invention.

DETAILED DESCRIPTION

Field-effect transistors exist in two major classifications, the junction FET (JFET) and the metal-oxide-semiconductor FET (MOSFET). A MOSFET is a special type of FET that works by electronically varying the width of a channel along which charge carriers (electrons or holes) flow. Wider channels provide better conductivity. The charge carriers enter the channel at the source, and exit via the drain. The width of the channel is controlled by the voltage on an electrode called the gate, which is located physically between the source and the drain and is insulated from the channel by an extremely thin layer of metal oxide.

There are two ways in which a MOSFET can function. The first is known as depletion mode. When there is no voltage on the gate, the channel exhibits its maximum conductance. As the voltage on the gate increases (either positively or negatively, depending on whether the channel is made of P-type or N-type semiconductor material), the channel conductivity decreases. The second mode of MOSFET operation is called enhancement mode. When there is no voltage on the gate, there is in effect no channel, and the device does not conduct. A channel is produced by the application of a voltage to the gate. Increasing gate voltage increases conductivity and thus, current flow.

The MOSFET has certain advantages over the conventional junction FET, or JFET because the gate is insulated electrically from the channel. No current flows between the gate and the channel, regardless of the gate voltage (as long as it does not become so great that it causes physical breakdown of the metallic oxide layer). Thus, the MOSFET has practically infinite impedance.

In this type of application, namely a DC/DC power converter, the salient characteristics of the semiconductor switch are its off voltage withstanding capability (the drain to source voltage) and its on resistance (which should be as low as possible). MOSFETS are used over JFETS because MOSFETS have much better drain to source voltage and on resistance characteristics.

When conventional non-radiation hardened N Channels FETs are used in applications where radiation is present, the FETs become uncontrollable at relatively low radiation levels because the gate threshold voltage of the N channel FET experiences a negative shift, and ultimately falls close to zero. At that point, the N channel FET conducts current with little or no gate voltage applied making it uncontrollable, like a flood gate that cannot be closed.

The gate threshold voltage of a conventional, non-radiation hardened P channel FET also shifts negatively with radiation exposure. However, the initial threshold voltage of an ordinary P channel FET is negative to begin with. In the presence of radiation, therefore, the gate threshold voltage does not approach zero and therefore will not become uncontrollable. The gate threshold voltage does change, but from a negative value to a more negative value. Conventional P channel FETs, therefore, are more robust to total radiation dose effects as compared to conventional N channel FETs when the proper gate drive signal is provided.

In accordance with an embodiment of the present invention, the gate drive signal should be high enough to saturate the drain to source channel. It should not, however, be so high that the gate to source breakdown voltage rating of the FET is exceeded. Preferably, the FET operates close to its maximum gate voltage signal. Higher signals can handle higher radiation levels, allowing the FET to function across a larger range of radiation exposure. For n-channel FETs, a negative gate bias should be implemented in the "off" mode. The negative bias will overcome the effect of trapped charges within the gate oxide and allow the n-channel FET to switch on and off despite negative shifts in the gate threshold voltage.

FIG. 1 shows the circuit topology for a radiation tolerant high power DC/DC converter according to an embodiment of the present invention. The main power stage shown in the block diagram is a two transistor forward converter. The main converter, however, may be any suitable hard switched or resonant topology using N channel FETs.

In use, input line or voltage 10 is applied to two circuit blocks using P channel FETs. The first block is a relatively low power DC/DC converter 11 that generates a bias voltage for the PWM circuit 12. Preferably, the output voltage of the converter 11 is 15 volts total, split to produce positive 12 VDC and negative 5 VDC. The converter 11 generates a negative bias level, so that conventional N channel FETs that have been irradiated may, nevertheless, be controlled, despite the fact their gate threshold voltage has dropped below zero volts.

A pulse width modulator (PWM) circuit 12 generates a pulse with modulated drive signal depending on the feedback voltage 22 from the main output. The pulse width output 20 drives the lower leg FET 16 and the upper leg FET 15 simultaneously. However, the lower FET drive 20 is direct coupled, while the upper leg FET 15 is driven through a transformer and DC restorer circuit 113. The DC restorer circuit 113 preferably contains a blocking capacitor, diode and zener diode.

The off and on voltage levels for the lower FET 16 gate are approximately −5 VDC and +10 VDC respectively. The gate voltage levels for the upper FET 15 are similar, due to clamping of the DC restorer circuit 113.

The input voltage 10 is also applied to a p-channel FET switch 14, which is an on/off switching stage that functions as a solid state relay. This solid state relay function is constructed using P channel FETs as the active element. Although the gate to source threshold value of the P channel FETs varies with total ionizing dose, no conduction ever occurs at zero gate to source voltage, regardless of total ionizing dose. Therefore, the function of these P channel FETs is "normally off". In an application such as a sold state relay, P channel FETs may be readily combined in series or parallel configurations to increase their overall cumulative ratings, since the switching action is performed at low switching speeds.

The P channel FET switch 14 is kept in the "off" state by the enable circuit 13 until the negative bias voltage derived by the converter 11 stabilizes at its desired negative voltage. When this condition is reached, the switch 14 is enabled and input voltage is applied to the upper N channel switching FET 15.

The main DC-DC converter power stage shown in this particular embodiment is preferably the two-transistor-forward-converter type. However, the topology of the main DC-DC converter may alternately be a flyback, single ended forward, half bridge, full bridge or any resonant variety of these types.

Describing the operation of the two-transistor-forward-converter type, an upper 15 and lower 16 N channel FET are connected in series with a power transformer 19 primary winding. The upper 15 and lower 16 FETs are fed from a controllable source of power as supplied from the P channel FET switch 14.

An upper catch diode 17 and a lower catch diode 18 in the upper and lower legs clamp the power transformer 19 primary across the input power line. This forces a limited reset voltage across the transformer 19 primary and limits the voltage stress on the upper 15 and lower 16 N channel FETs to approximately the input voltage.

The secondary winding of the transformer 19 is connected to an output rectifier 110. The rectifier 110 includes series and shunt diodes, smoothed by a filter 111. The output of the smoothing filter 111 feeds the load 24 of the circuit.

A sample of the output voltage is isolated by a feedback isolator 112 and fed back to the PWM (pulse width modulator) circuit 12. The PWM circuit 12 adjusts the pulse width of the gate drive for the upper 15 and lower 16 N channel FETs to produce the desired output voltage.

As mentioned previously, the lower 16 and upper 15 N channel FETs are driven simultaneously in the two-transistor-forward converter topology of the preferred embodiment discussed above. The lower 16 N channel FET is driven directly by the PWM circuit 12.

The source voltage of the lower N channel FET 16 should be about the power input return potential. Since the PWM circuit 12 is biased approximately five volts below the input ground level, the gate to source drive signal for the lower 16 N channel FET swings from approximately negative 4 VDC to positive 8 VDC.

In accordance with the principles of the present invention, a negative gate drive signal allows even conventional n-channel FETs to function properly, despite being irradiated. IN other words, because of the negative gate drive signal level, conventional n-channel FETs that have been irradiated may, nevertheless, be properly controlled, despite the fact their gate threshold voltage has dropped below zero volts.

In further detail, the drive signal for the upper N channel FET 15 is AC coupled through the transformer 19. On the secondary side of the transformer 19, the secondary winding is connected to a blocking capacitor in series and a series connected zener diode and conventional diode in shunt. This circuit acts as a DC restorer, however the low level of the gate drive waveform is several volts more negative than zero, reference to the N channel FET's source terminal. The extent of the negative gate voltage is determined by the magnitude of the zener diode voltage.

By extension, this same technique can be used for radiation hardened Motor Drives.

In the preceding specification, the invention has been described with reference to specific exemplary embodiments thereof. It will however, be evident that various modifications and changes may be made thereto without departing from the broader spirit and scope of the invention as set forth in the claims that follow. The specification and drawings are accordingly to be regarded in an illustrative manner rather than a restrictive sense.

What is claimed is:

1. A radiation tolerant electrical component for providing controlled electrical response in radiation-intensive applications, the component comprising:
   a non-hardened p-channel FET supplying input voltage to a non-hardened n-channel FET with a negative bias to provide a controlled electrical output from the n-channel FET;
   wherein the non-hardened p-channel FET has an initial threshold voltage; and
   wherein the initial threshold voltage of the non-hardened p-channel FET is negative to begin with,
   a PWM circuit operably connected between the non-hardened p-channel FET and the non-hardened n-channel FET,
   a feedback isolator operably connected between the PWM circuit and the electrical output.

2. The electrical component of claim 1 wherein the non-hardened p-channel FET is a p-channel FET DC/DC Converter.

3. The electrical component of claim 1 further comprising an enable circuit operably connected between the non-hardened p-channel FET and the non-hardened n-channel FET.

4. The electrical component of claim 1 further comprising a power transformer operably connected between the non-hardened n-channel FET and the electrical output.

5. The electrical component of claim 4 further comprising a rectifier operably connected between the power transformer and the electrical output.

6. The electrical component of claim 4 further comprising a filter operably connected between the rectifier and the electrical output.

7. The electrical component of claim 4 wherein the power transformer is two-transistor-forward.

8. The electrical component of claim 4 wherein the power transformer is a flyback transformer.

9. The electrical component of claim 4 wherein the power transformer is single-eneded-forward.

10. The electrical component of claim 4 wherein the power transformer is half-bridged.

11. The electrical component of claim 4 wherein the power transformer is full-bridged.

12. The electrical component of claim 4 wherein the power transformer is resonant two-transistor-forward.

13. The electrical component of claim 4 wherein the power transformer is a resonant flyback transformer 14. The electrical component of claim 4 wherein the power transformer is resonant single-ended-forward.

15. The electrical component of claim 4 wherein the power transformer is resonant half-bridged.

16. The electrical component of claim 4 wherein the power transformer is resonant full-bridged.

17. The electrical component of claim 1 wherein the component is a high-power-DC/DC converter.

18. A radiation tolerant electrical component for providing controlled electrical response in radiation-intensive applications, the component comprising:
    a p-channel FET DC/DC Converter;
    a PWM circuit;
    an enable circuit;
    a DC restorer;
    a p-channel FET switch;
    an upper-n-channel FET;
    a lower-n-channel FET;
    a power transformer;
    an upper-catch diode;
    a lower-catch diode;
    a rectifier;
    a filter; and,
    a feedback isolator;
    wherein:
    the p-channel FET DC/DC converter is operably connected to a voltage source;
    the PWM circuit is operably connected to the p-channel FET DC/DC converter;
    the enable circuit is operably connected to the p-channel FET DC/DC converter;
    the DC restorer is operably connected to the PWM circuit;
    the p-channel FET switch is operably connected to the voltage source;
    the upper-n-channel FET is operably connected to the p-channel FET switch;
    lower-n-channel FET is operably connected to the PWM circuit;
    the power transformer is operably connected to the upper and lower-n-channel switching FET;
    the upper and lower-catch diodes are operably connected to the power transformer;
    the rectifier is operably connected to the power transformer;
    the filter is operably connected to the rectifier;
    the feedback isolator is operably connected to the filter and PWM circuit;
    wherein the non-hardened p-channel FET has an initial threshold voltage; and
    wherein the initial threshold voltage of the non-hardened p-channel FET is negative to begin with.

* * * * *